United States Patent
Mao et al.

(10) Patent No.: US 11,661,333 B2
(45) Date of Patent: May 30, 2023

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Wei-Jhih Mao, Hsinchu (TW); Shang-Ying Tsai, Taoyuan County (TW); Kuei-Sung Chang, Kaohsiung (TW); Chun-Wen Cheng, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 170 days.

(21) Appl. No.: 17/070,341

(22) Filed: Oct. 14, 2020

(65) Prior Publication Data

US 2022/0112074 A1  Apr. 14, 2022

(51) Int. Cl.
  *B81B 3/00*  (2006.01)
  *B81C 1/00*  (2006.01)

(52) U.S. Cl.
  CPC ........ *B81B 3/0021* (2013.01); *B81C 1/00166* (2013.01); *B81C 1/00825* (2013.01);
  (Continued)

(58) Field of Classification Search
  CPC .......... B81B 3/0021; B81B 2201/0228; B81B 2201/0292; B81B 2201/038; B81B 2203/04; B81B 2201/0235; B81B 2201/033; B81B 2203/0163; B81B 2203/055; B81B 7/0016; B81C 1/00166; B81C 1/00825; G01C 19/5733; G01L 9/0044; G01P 15/131; G01H 11/00
  See application file for complete search history.

(56) References Cited

U.S. PATENT DOCUMENTS

| | | | |
|---|---|---|---|
| 5,491,604 A * | 2/1996 | Nguyen | H03H 9/02425 333/197 |
| 7,337,671 B2 * | 3/2008 | Ayazi | G01P 15/0802 73/514.32 |

(Continued)

OTHER PUBLICATIONS

"A 0.13-μm CMOS Dynamically Reconfigurable Charge Pump for Electrostatic MEMS Actuation", Abdul Hafiz Alameh and Frederic Nabki, IEEE Transactions on Very Large Scale Integration (VLSI) Systems, vol. 25, No. 4, Apr. 2017.

(Continued)

*Primary Examiner* — Yasser A Abdelaziez
(74) *Attorney, Agent, or Firm* — WPAT Law; Anthony King

(57) ABSTRACT

A semiconductor structure includes a substrate; a sensing device disposed over the substrate and including a plurality of protruding members protruded from the sensing device; a sensing structure disposed adjacent to the sensing device and including a plurality of sensing electrodes protruded from the sensing structure towards the sensing device; and an actuating structure disposed adjacent to the sensing device and configured to provide an electrostatic force on the sensing device based on a feedback from the sensing structure. Further, a method of manufacturing the semiconductor structure is also disclosed.

20 Claims, 16 Drawing Sheets

(52) U.S. Cl.
CPC ......... *B81B 2201/0228* (2013.01); *B81B 2201/0292* (2013.01); *B81B 2201/038* (2013.01); *B81B 2203/04* (2013.01)

(56) References Cited

U.S. PATENT DOCUMENTS

| | | | |
|---|---|---|---|
| 2006/0205106 A1* | 9/2006 | Fukuda | B81C 1/00246 |
| | | | 438/52 |
| 2017/0166437 A1* | 6/2017 | Klein | H04R 19/005 |
| 2020/0096536 A1* | 3/2020 | Zou | G01P 15/097 |

OTHER PUBLICATIONS

"A Study of the Effect of the Fringe Fields on the Electrostatic Force in Vertical Comb Drives", Else Gallagher and Walied Moussa, IEEE Sensors, 2014.

* cited by examiner

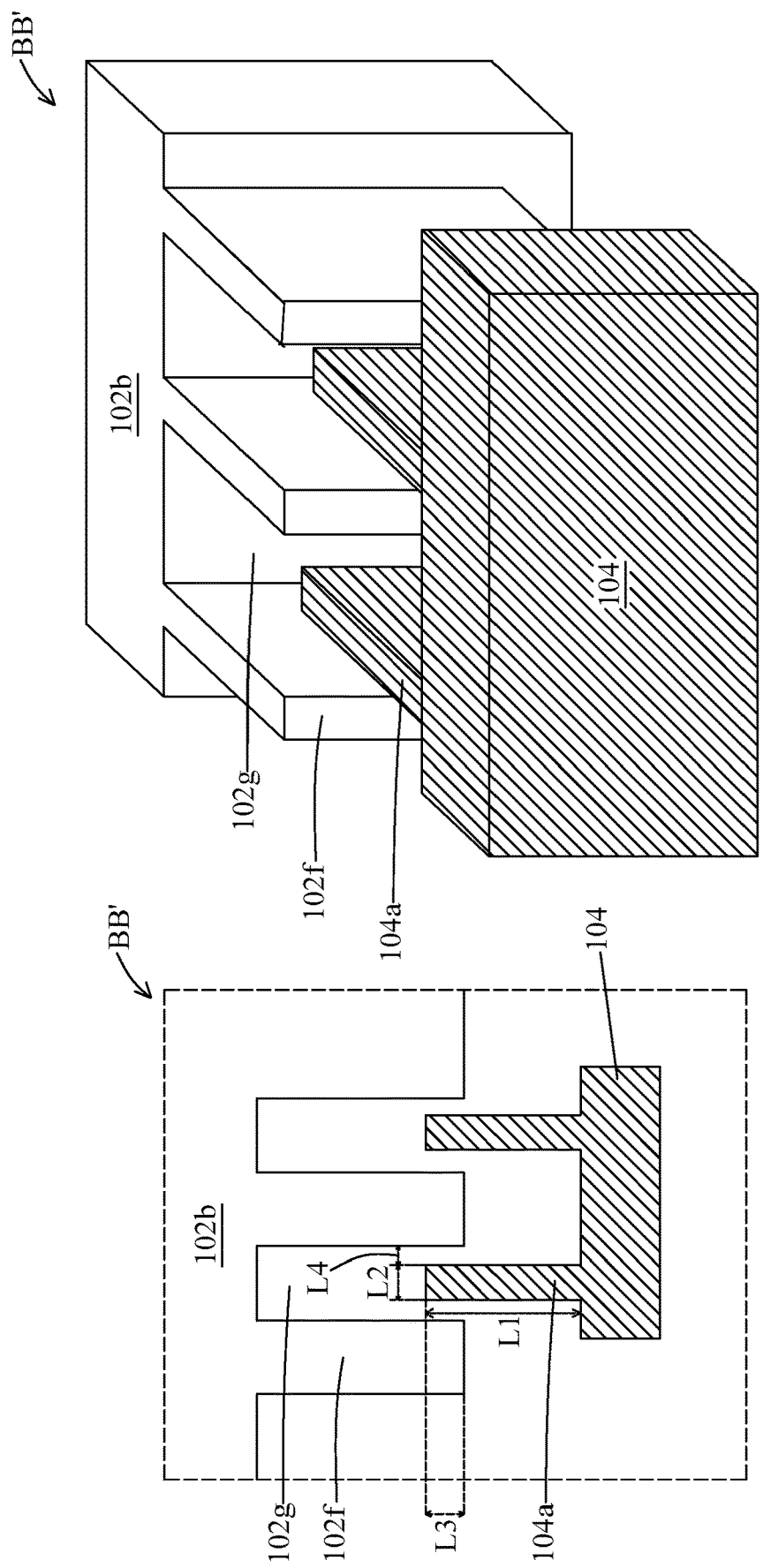

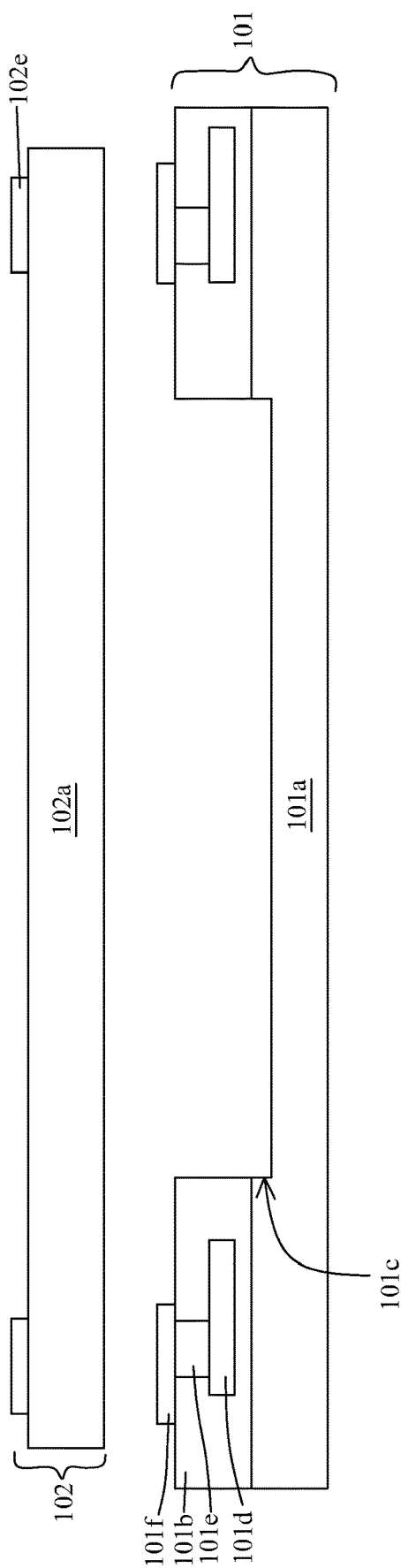
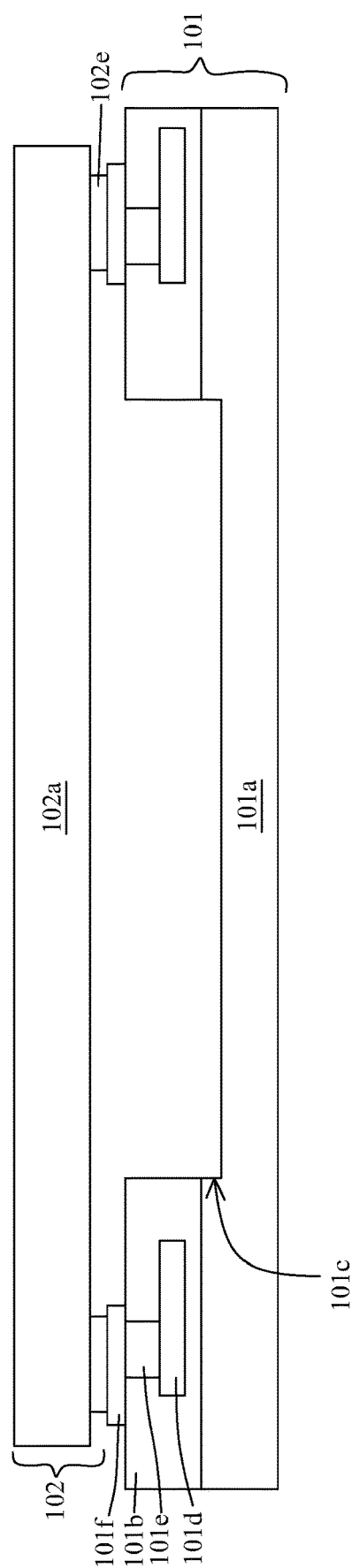
FIG. 15
FIG. 16

SEMICONDUCTOR STRUCTURE AND MANUFACTURING METHOD THEREOF

BACKGROUND

Electronic equipment involving semiconductive devices are essential for many modern applications. The semiconductive device has experienced rapid growth. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Micro-electro mechanical system (MEMS) devices have been recently developed and are also commonly involved in electronic equipment. The MEMS device is micro-sized device, usually in a range from less than 1 micron to several millimeters in size. The MEMS device includes fabrication using semiconductive materials to form mechanical and electrical features. The MEMS device may include a number of elements (e.g., stationary or movable elements) for achieving electro-mechanical functionality. For many applications, MEMS device is electrically connected to external circuitry to form complete MEMS systems. Commonly, the connections are formed by wire bonding. MEMS devices are widely used in various applications. MEMS applications include motion sensor, gas detectors, pressure sensors, printer nozzles, or the like. Moreover, MEMS applications are extended to optical applications, such as movable mirrors, and radio frequency (RF) applications, such as RF switches or the like.

As technologies evolve, design of the devices becomes more complicated in view of small dimension as a whole and increase of functionality and amounts of circuitries. Numerous manufacturing operations are implemented within such a small and high performance semiconductor device. The manufacturing of the semiconductor device in a miniaturized scale becomes more complicated. The increase in complexity of manufacturing may cause deficiencies such as high yield loss, poor reliability of the electrical interconnection, warpage, etc. Therefore, there is a continuous need to modify structure and manufacturing method of the devices in the electronic equipment in order to improve the device performance as well as reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 3 is an enlarged view of a portion BB' of FIG. 1.

FIG. 4 is an enlarged perspective view of the portion BB' of FIG. 1.

FIGS. 12-19 are schematic views of various stages of manufacturing a semiconductor structure by the method of FIG. 11 in accordance with some embodiments of the present disclosure.

DETAILED DESCRIPTION OF THE DISCLOSURE

Figure 1:
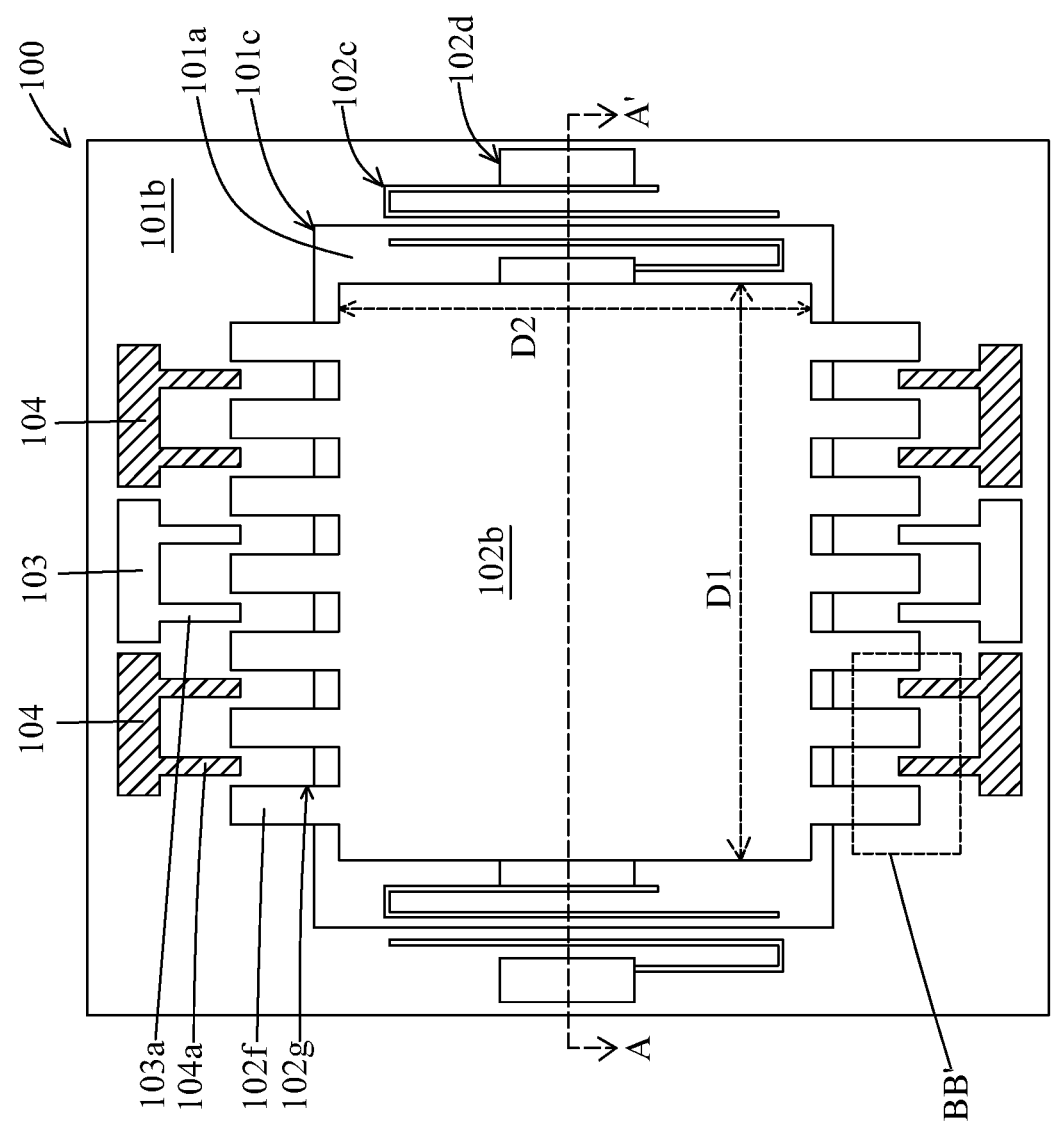
FIG. 1 is a schematic top cross-sectional view of a first semiconductor structure in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or features) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art.

Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An electronic equipment can include a MEMS device, and the MEMS device can be integrated onto a semiconductive chip in recent generation of MEMS applications. The MEMS device is in micro sized and therefore it would be easily damaged by an accidental external force, even a small external force may cause serious damage on the MEMS device. A damper or stopper may be formed around the MEMS device for absorbing the external force on the MEMS device in order to stabilize the MEMS device back to an equilibrium or static state.

However, such damper can only passively protect the MEMS device. The accidental external force may be sufficiently large, and as a result the MEMS device may collide with the damper or stopper and cause damage on the MEMS device. Further, after the application of the external force on the MEMS device, the MEMS device may require a long time to be stabilized or return to the equilibrium or static state. The damper would not facilitate the stabilization of the MEMS device after the hitting. Therefore, performance and reliability of the MEMS device are adversely affected.

The present disclosure is directed to a semiconductor structure including an active damping mechanism for protecting a device in the semiconductor structure, preventing the device from damage by an external force, and effectively damping the device after the application of the external force on the device. In some embodiments, the semiconductor structure includes a sensing structure for sensing the external force on the device, and an actuating structure for applying an electrostatic force on the device based on a feedback from the sensing structure. When the sensing structure detects the present of the external force on the device, the sensing structure transmits the feedback to actuate the actuating structure. The actuating structure would provide the electrostatic force on the device based on the feedback to oppose the external force. Therefore, the external force can be effectively suppressed by the electrostatic force. As a result, the device can be prevented from damage by the external force and can be returned to equilibrium or static state quickly. Other embodiments are also disclosed.

Figure 2:
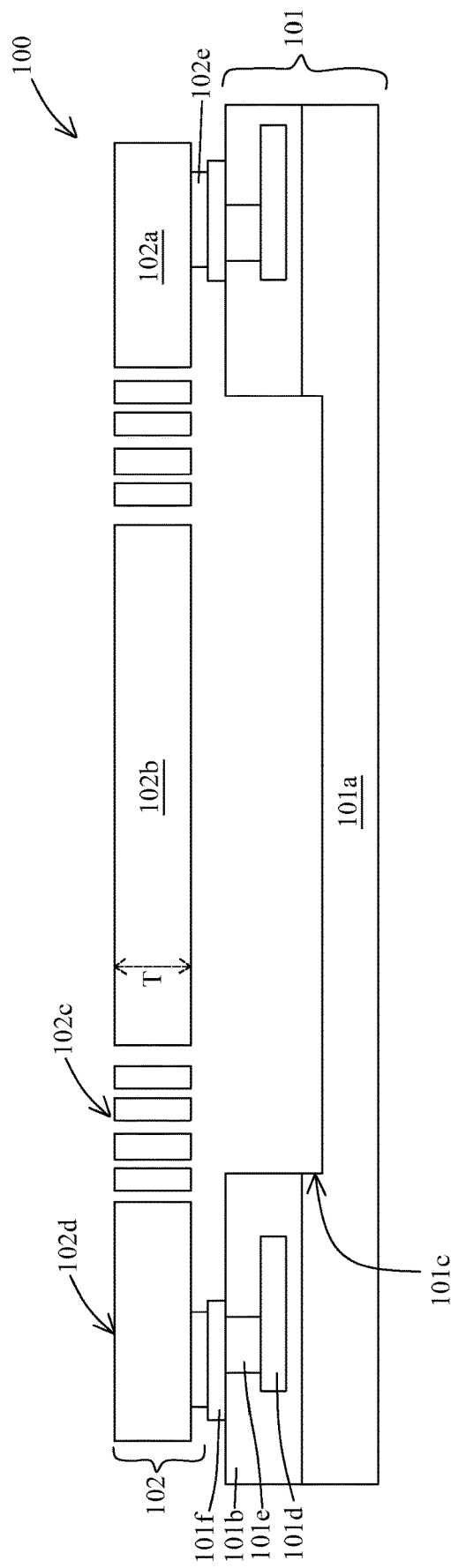
FIG. 2 is a schematic cross-sectional view of the first semiconductor structure along a line AA' of FIG. 1.

FIG. 1 is a schematic top view of a first semiconductor structure 100 in accordance with some embodiments of the present disclosure. FIG. 2 is a schematic cross-sectional view along a line AA' of FIG. 1. FIG. 3 is an enlarged view of a portion BB' of FIG. 1. FIG. 4 is an enlarged perspective view of the portion BB' of FIG. 1. In some embodiments, the first semiconductor structure 100 is configured for MEMS application. In some embodiments, the first semiconductor structure 100 includes a first wafer 101 and a second wafer 102 bonded over the first water 101 and includes a device 102b formed over the first wafer 101.

In some embodiments, the first wafer 101 includes a first substrate 101a and a dielectric layer 101b disposed over the first substrate 101a. In some embodiments, the first substrate 101a is a semiconductive substrate. In some embodiments, the first substrate 101a is a silicon substrate, a silicon germanium substrate, or a substrate formed of other semiconductor materials. In some embodiments, the first substrate 101a is a glass substrate. In some embodiments, the first substrate 101a is a ceramic substrate.

In some embodiments, the dielectric layer 101b is disposed on the substrate 101a. In some embodiments, the dielectric layer 101b includes dielectric material such as oxide or the like. In some embodiments, the dielectric layer 101b includes silicon dioxide. In some embodiments, the first wafer 101 includes a cavity 101c extending through the dielectric layer 101b and partially through the first substrate 101a. In some embodiments, at least a portion of a surface of the substrate 101a is exposed by the cavity 101c.

In some embodiments, the first wafer 101 includes an interconnect structure for electrically connecting with the second wafer 102. In some embodiments, the interconnect structure is configured to electrically connect a circuitry or an electrical component in the first substrate 101a to an external circuitry or component. In some embodiments, the interconnect structure is disposed within the dielectric layer 101b. In some embodiments, the interconnect structure includes a conductive member 101d and a conductive via 101e extending from the conductive member 101d. In some embodiments, the conductive member 101d elongates along and within the dielectric layer 101b.

In some embodiments, the conductive member fold is configured to electrically connect to a circuitry or electrical component in the first substrate 101a. In some embodiments, the conductive member 101d includes conductive material such as metal or the like, or semiconductive material such as polysilicon or the like. In some embodiments, the conductive via bole extends substantially vertical to the conductive member 101d. In some embodiments, the conductive via 101e extends vertically from a surface of the dielectric layer 101b towards the conductive member 101d. In some embodiments, the conductive via 101e includes conductive material such as metal or the like. In some embodiments, the conductive via 101e includes tungsten, copper, gold or the like.

In some embodiments, the first wafer 101 includes a first bonding pad 101f disposed on the dielectric layer 101b. In some embodiments, the first bonding pad 101f is electrically connected with the interconnect structure in the first wafer 101. In some embodiments, the first bonding pad 101f is electrically coupled with the conductive via 101e. In some embodiments, the first bonding pad 101f is electrically connected to a circuitry or electrical component in the first substrate 101a through the interconnect structure. In some embodiments, the first bonding pad 101f is configured to receive with external conductive structure. In some embodiments, the first bonding pad 101f includes conductive material such as metal or the like. In some embodiments, the first bonding pad 101f includes aluminum, copper, titanium, gold, nickel or the like.

In some embodiments, the second wafer 102 is disposed over the first wafer 101. In some embodiments, the second wafer 102 includes a second substrate 102a. In some embodiments, the second substrate 102a is a semiconductive substrate. In some embodiments, the second substrate 102a is a silicon substrate, a silicon germanium substrate, or a substrate formed of other semiconductor materials. In some embodiments, the second substrate 102a includes electrical circuits formed over or in the second substrate 102a. In some embodiments, the second substrate 102a includes transistors, capacitors, resistors, diodes, photo-diodes and/or the like. In some embodiments, the second substrate 102a is a MEMS substrate including electro-mechanical elements.

In some embodiments, the second wafer 102 includes a device 102b. In some embodiments, the device 102b is formed from the second substrate 102a. In some embodiments, the device 102b is a MEMS device. In some embodiments, the device 102b is a sensor. In some embodiments, the device 102b is an inertial sensor. In some embodiments, the device 102b is a sensing device. In some embodiments, the device 102b is a microphone, a pressure sensor, an accelerometer, a gyroscope, a magnetometer, resonator, MEMS actuator, optical device or any other device that interfaces with the external environment. In some embodiments, the device 102b is a sensing device such as an accelerometer, a gyroscope or the like. In some embodiments, the device 102b is configured to measure linear/angular velocity or acceleration. In some embodiments, the device 102b includes a proof mass.

In some embodiments, a thickness T of the device 102b is about 10 um to about 50 um. In some embodiments, the thickness T of the device 102b is about 30 un. In some embodiments, a width D1 of the device 102b is about 150 um to about 250 um. In some embodiments, the width D1 is about 200 um. In some embodiments, a length D2 of the device 102b is about 200 um to about 300 um. In some embodiments, the length D2 is about 250 um. In some embodiments, the width D1 is substantially equal to the length D2. In some embodiments, the thickness and the dimension of the device 102b are dependent on optimal sensitivity of the device 102b.

In some embodiments, the second wafer 102 includes a spring structure 102c for allowing oscillation or movement of the device 102b. In some embodiments, the spring structure 102c is formed from the second substrate 102a. In some embodiments, the spring structure 102c is coupled to the device 102b and disposed at a periphery of the device 102b. In some embodiments, the device 102b and the spring structure 102c are movable relative to each other.

In some embodiments, the second wafer 102 includes an anchoring structure 102d for anchoring the device 102b to the second substrate 102a. In some embodiments, the anchoring structure 102d is formed from the second substrate 102a. In some embodiments, the device 102b is coupled to the anchoring structure 102d through the spring structure 102c. In some embodiments, the anchoring structure 102d is disposed at the periphery of the device 102b. In some embodiments, the device 102b is movable relative to the anchoring structure 102d and the second substrate 102a.

In some embodiments, the second wafer 102 includes a second bonding pad 102e disposed on the second substrate 102a. In some embodiments, the second bonding pad 102e is electrically connected the device 102b to an external conductive structure. In some embodiments, the second bonding pad 102e is electrically connected to a circuitry or electrical component in the second substrate 102a. In some embodiments, the second bonding pad 102e is configured to receive with external conductive structure. In some embodiments, the second bonding pad 102e includes conductive material such as metal or the like. In some embodiments, the second bonding pad 102e includes aluminum, copper, titanium, gold, nickel or the like.

In some embodiments, the second bonding pad 102e is disposed opposite to the first bonding pad 101f. In some embodiments, the second substrate 102a is bonded over the first substrate 101a by bonding the first bonding pad 101f with the second bonding pad 102e. As such, the first substrate 101a is electrically connected with the second substrate 102a through the first bonding pad 101f and the second bonding pad 102e. In some embodiments, the first bonding pad 101f is eutectically bonded with the second bonding pad 102e.

In some embodiments, the device 102b is disposed over the first substrate 101a. In some embodiments, the device 102b is disposed above the cavity 101c of the first substrate 101a, In some embodiments, the device 102b is movable relative to the first wafer 101. In some embodiments, a width of the cavity 101c is substantially greater than the width D1 of the device 102b. In some embodiments, the device 102b is vertically aligned with the cavity 101c.

In some embodiments, the device 102b includes several protruding members 102f protruded from the device 102b. In some embodiments, the protruding members 102f are disposed at the periphery of the device 102b. In some embodiments, the protruding members 102f are disposed in a consistent pitch. In some embodiments, several recesses 102g are alternately disposed with the protruding members 102f. In some embodiments, the recess 102g is disposed between two adjacent protruding members 102f.

In some embodiments, the first semiconductor structure 100 includes a sensing structure 103 disposed adjacent to the device 102b. In some embodiments, the sensing structure 103 is disposed opposite to at least one of the protruding members 102f. In some embodiments, the sensing structure 103 is stationary. In some embodiments, the sensing structure 103 includes conductive material such as metal or the like. In some embodiments, the sensing structure 103 includes copper, gold or the like. In some embodiments, the sensing structure 103 is electrically connected to the interconnect structure in the dielectric layer 101b, the first substrate 101a or the second substrate 102a.

In some embodiments, the sensing structure 103 is configured to sense an external force on the device 102b and provide a feedback corresponding to the external force. For example, when the first semiconductor structure 100 is accidentally dropped, an external force (e.g. gravitational force) is acted on the device 102b during the dropping. The sensing structure 103 can sense the present of the external force, and then transmit a feedback corresponding to the external force to the device 102b, a circuitry or a component of the first semiconductor structure 100.

In some embodiments, the sensing structure 103 includes several sensing electrodes 103a. The sensing electrodes 103a are protruded from the sensing structure 103 towards the device 102b. In some embodiments, the sensing electrodes 103a are alternately disposed with the protruding members 102f of the device 102b. In some embodiments, the sensing electrode 103a is disposed between at least two protruding members 102f.

In some embodiments, the first semiconductor structure 100 includes an actuating structure 104 disposed adjacent to the device 102b. In some embodiments, the actuating structure 104 is disposed opposite to at least one of the protruding members 102f. In some embodiments, the actuating structure 104 is isolated from the sensing structure 103. In some embodiments, the device 102b is movable relative to the sensing structure 103. In some embodiments, the sensing structure 103 is static. In some embodiments, the actuating structure 104 and the sensing structure 103 surround the device 102b. In some embodiments, the actuating structure 104 and the sensing structure 103 are alternately disposed. In some embodiments, the actuating structure 104 includes conductive material such as metal or the like. In some embodiments, the actuating structure 104 includes copper, gold or the like. In some embodiments, the actuating structure 104 is electrically connected to the interconnect structure in the dielectric layer 101b, the first substrate 101a or the second substrate 102a. In some embodiments, an electrical path of the actuating structure 104 is separated from an electrical path of the sensing structure 103.

In some embodiments, the actuating structure 104 is configured to provide an electrostatic force on the device 102b based on the feedback from the sensing structure 103. For example, when the sensing structure 103 transmits the feedback corresponding to the external force detected by the sensing structure 103, the actuating structure 104 provides the electrostatic force on the device 102b based on the feedback from the sensing structure 103 in order to act against the external force, such that the device 102b can be stabilized and return to equilibrium or static state. The device 102b can be protected from damages by the external force. In some embodiments, the electrostatic force provided by the actuating structure 104 facilitates the device 102b returning to equilibrium or static state in minimum duration. In some embodiments, the electrostatic force provided by the actuating structure 104 is substantially greater than or equal to the external force.

In some embodiments, the actuating structure 104 includes several actuating electrodes 104a protruded from the actuating structure 104 towards the device 102b. In some embodiments, the actuating electrodes 104a are alternately disposed with the protruding members 102f of the device 102b in some embodiments, the actuating electrode 104a is disposed between at least two protruding members 102f. In some embodiments, the protruding members 102f are isolated from the actuating electrodes 104a.

In some embodiments, each of the actuating electrode 104a has a length L1 extending from the actuating structure 104 towards the device 102b and a width L2 substantially orthogonal to the length L1 In some embodiments, a ratio of the length L1 to the width L2 is substantially less than or equal to 10. In some embodiments, the ratio is substantially less than 5. As the ratio increases, a stiffness of the actuating electrode 104a would be a concern. In some embodiments, a total number of the actuating electrodes 104a is substantially less than a total number of the sensing electrodes 103a. In some embodiments, a total top cross-sectional area of the sensing electrodes 103a is substantially greater than a total top cross-sectional area of the actuating electrodes 104a.

In some embodiments, the actuating electrodes 104a are protruded into the recesses 102g correspondingly. In some embodiments, the actuating electrode 104a is protruded into the recess 102g in a length L3 substantially less than or equal to 5 um. In some embodiments, the length L3 is substantially less than or equal to 2 um. As the length L3 increases, electrostatic force on the device 102b may be reduced. In some embodiments, a gap L4 between the protruding member 102f and the actuating electrode 104a is about 1 um to about 5 um. As the gap L4 decreases, larger electrostatic force on the device 102h can be provided.

Figure 5:
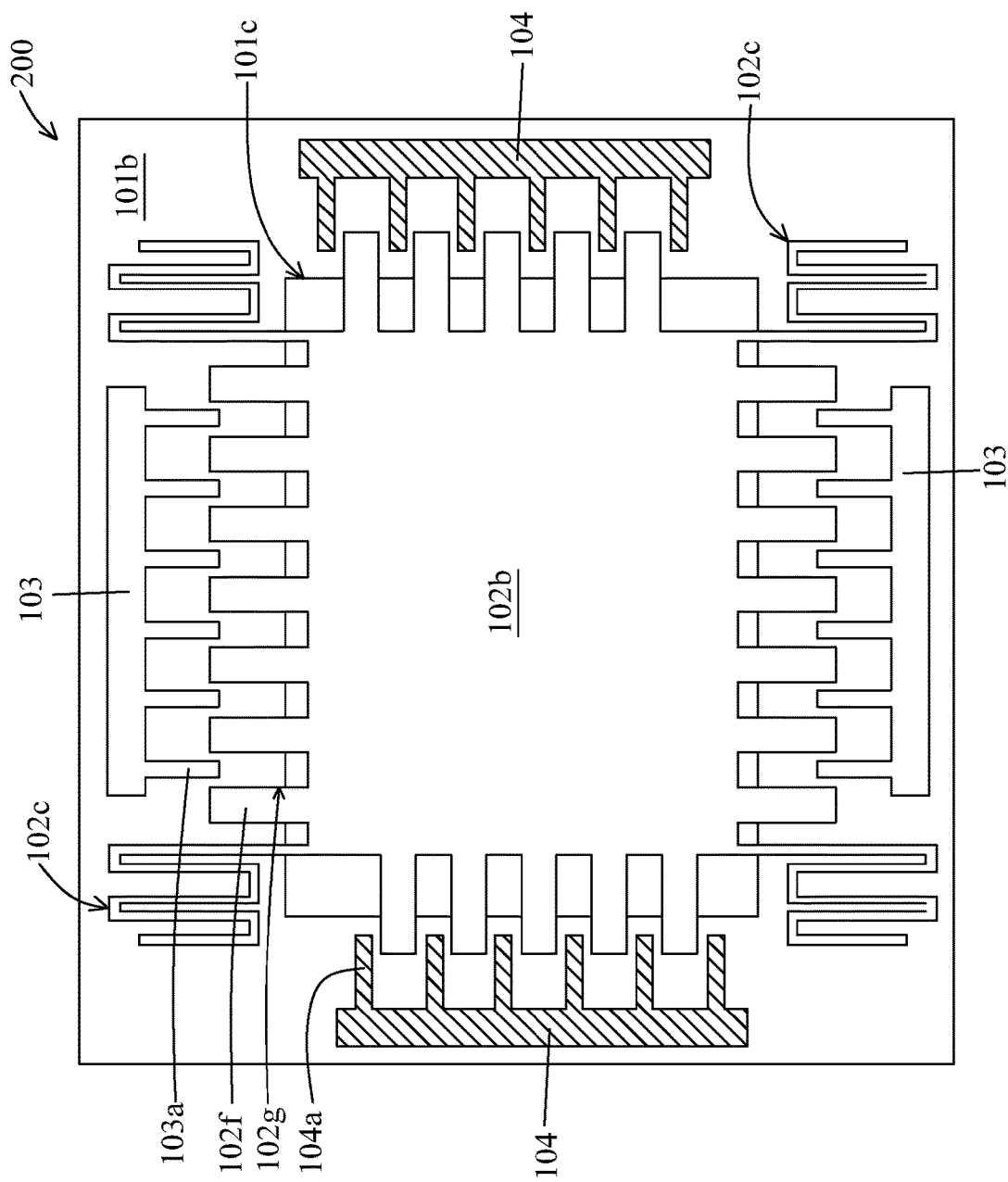
FIG. 5 is a schematic top cross-sectional view of a second semiconductor structure in accordance with some embodiments of the present disclosure.

FIG. 5 is a schematic top view of a second semiconductor structure 200 in accordance with some embodiments of the present disclosure. In some embodiments, the second semiconductor structure 200 is similar to the first semiconductor structure 100, except the arrangement of the sensing structures 103 and the actuating structures 104. In some embodiments, the sensing structures 103 are disposed opposite to each other, and the actuating structures 104 are disposed opposite to each other. In some embodiments, the sensing structure 103 is disposed along an entire edge of the device 102b. In some embodiments, the actuating structure 104 is disposed along an entire edge of the device 102b.

In some embodiments, the sensing structure 103 and the actuating structure 104 surround the device 102b entirely. In some embodiments, a total number of the actuating electrodes 104a is substantially same as a total number of the sensing electrodes 103a. In some embodiments, a total top cross-sectional area of the sensing electrodes 103a is substantially same as a total top cross-sectional area of the actuating electrodes 104a.

Figure 6:
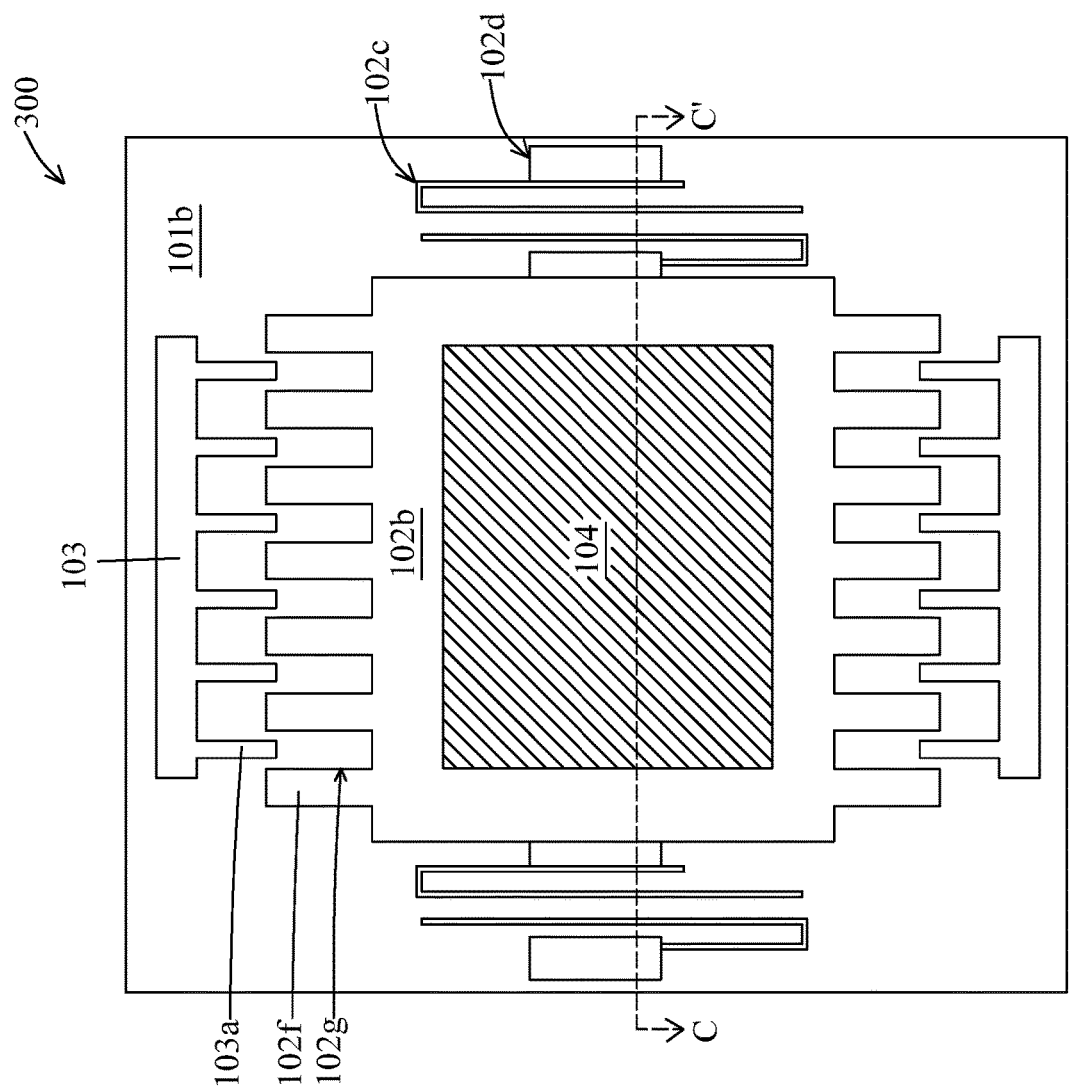
FIG. 6 is a schematic top cross-sectional view of a third semiconductor structure in accordance with some embodiments of the present disclosure.
Figure 7:
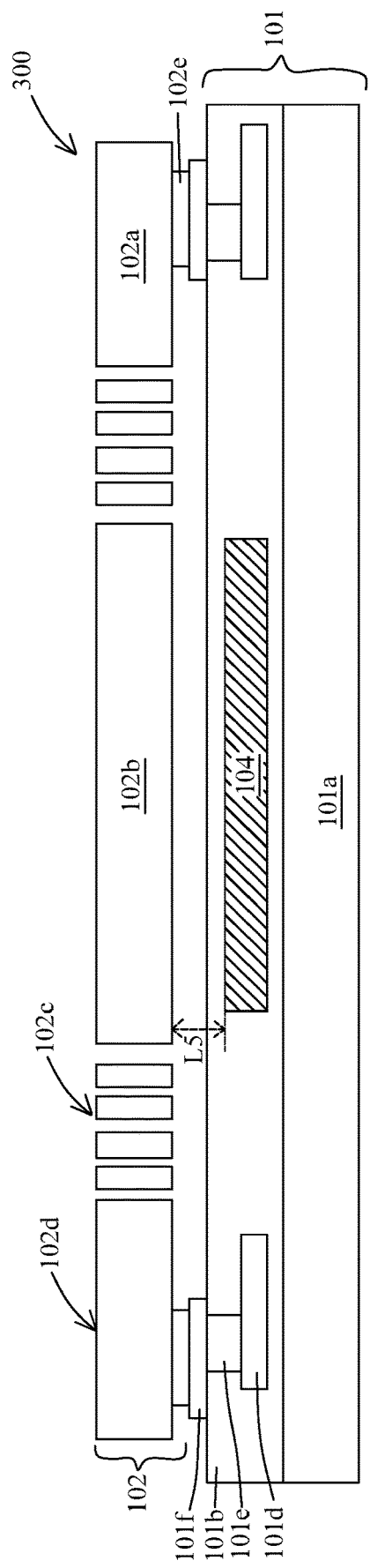
FIG. 7 is a schematic cross-sectional view of the third semiconductor structure along a line CC' of FIG. 6.

FIG. 6 is a schematic top view of a third semiconductor structure 300 in accordance with some embodiments of the present disclosure. FIG. 7 is a schematic cross-sectional view along a line CC' of FIG. 6. In some embodiments, the third semiconductor structure 300 is similar to the first semiconductor structure 100, except the absence of the cavity in the first wafer 101, the configuration of the actuating structure 104 and the arrangement of the sensing structure 103 and the actuating structure 104. In some embodiments, the first wafer 101 does not include a cavity extending through the dielectric layer 101b.

In some embodiments, the actuating structure 104 is disposed within the dielectric layer 101b of the first wafer 101. In some embodiments, the actuating structure 104 is elongated along the dielectric layer 101b. In some embodiments, the actuating structure 104 is disposed between the first substrate 101a and the device 101b. In some embodiments, the device 102b and the actuating structure 104 are vertically aligned. In some embodiments, the actuating structure 104 is in a plane configuration. In some embodiments, the actuating structure 104 is electrically connected to the interconnect structure. In some embodiments, the actuating structure 104 is electrically connected to the conductive member 101d.

In some embodiments, a distance L5 between the device 101b and the actuating structure 104 is about 15 um to about 20 um. As the distance L5 decreases, performance of the device 102b may decrease. As the distance L5 increases, a larger electrostatic force is required to move the device 102b. In some embodiments, a dimension of the actuating structure 104 is substantially smaller than a dimension of the deice 102b. In some embodiments, the actuating structure 104 includes conductive or semiconductive material. In some embodiments, the actuating structure 104 includes polysilicon or the like.

In some embodiments, when the sensing structure 103 transmits the feedback corresponding to an external force detected by the sensing structure 103, the actuating structure 104 provides an electrostatic force on the device 102b based on the feedback from the sensing structure 103 in order to act against the external force, such that the device 102b can be stabilized and return to equilibrium or static state. In some embodiments, the electrostatic force provided by the actuating structure 104 pulls the device 102b towards the first wafer 101 in order to act against the external force, stabilize the device 102b and facilitate the device 102b returning to equilibrium or static state. Therefore, the device 102b can be protected from damages by the external force. In some embodiments, the electrostatic force provided by the actuating structure 104 facilitates the device 102b returning to equilibrium or static state in minimum duration. In some embodiments, the electrostatic force provided by the actuating structure 104 is substantially greater than or equal to the external force.

Figure 8:
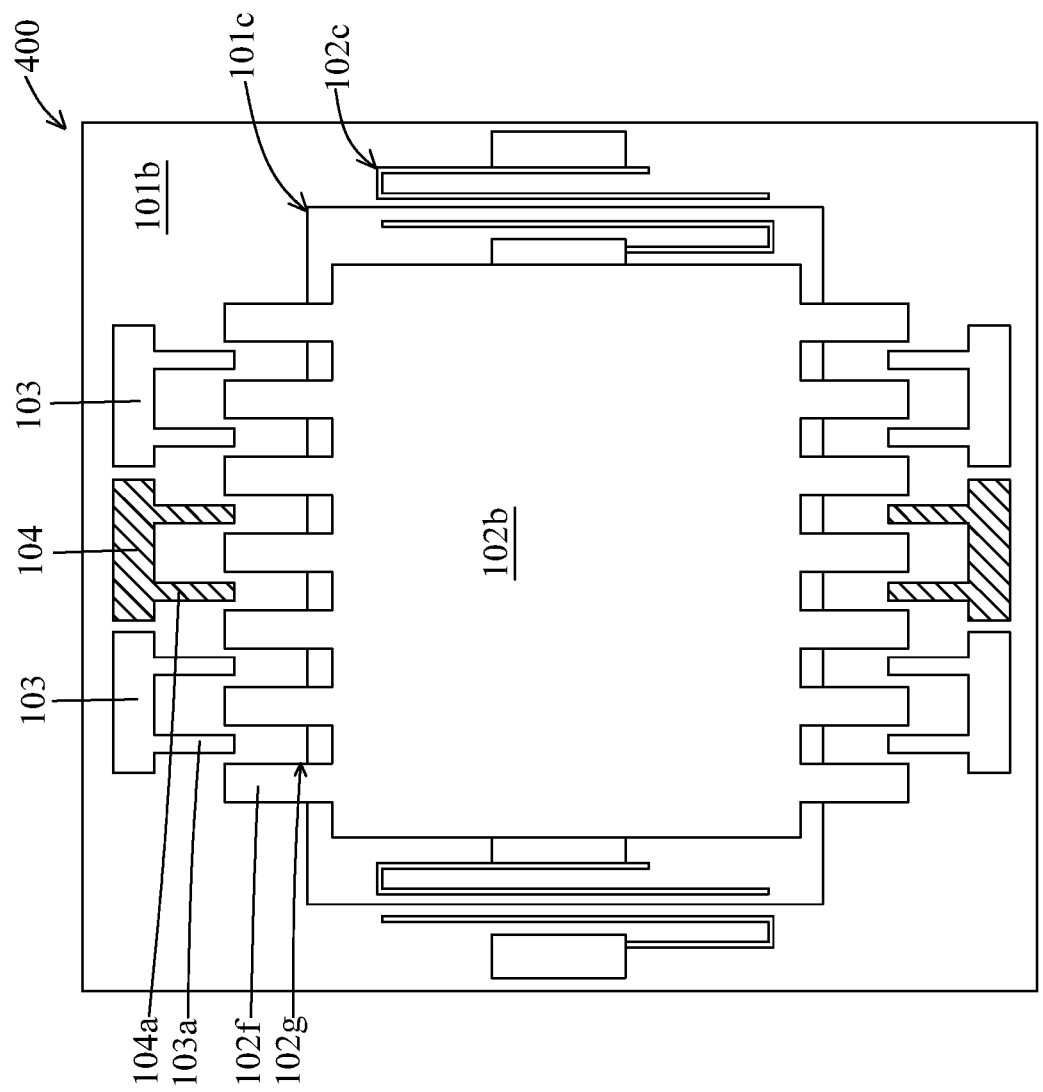
FIG. 8 is a schematic top cross-sectional view of a fourth semiconductor structure in accordance with some embodiments of the present disclosure.

FIG. 8 is a schematic top view of a fourth semiconductor structure 400 in accordance with some embodiments of the present disclosure. In some embodiments, the fourth semiconductor structure 400 is similar to the first semiconductor structure 100, except the device 102b is an actuating device. In some embodiments, the device 102b is a resonator, a movable micro stage, an optical device, an actuator or the like. In some embodiments, a total number of the actuating electrodes 104a is substantially greater than a total number of the sensing electrodes 103a. In some embodiments, a total top cross-sectional area of the sensing electrodes 103a is substantially less than a total top cross-sectional area of the actuating electrodes 104a. In some embodiments, the sensing structure 103 surrounds the actuating structure 104.

Figure 9:
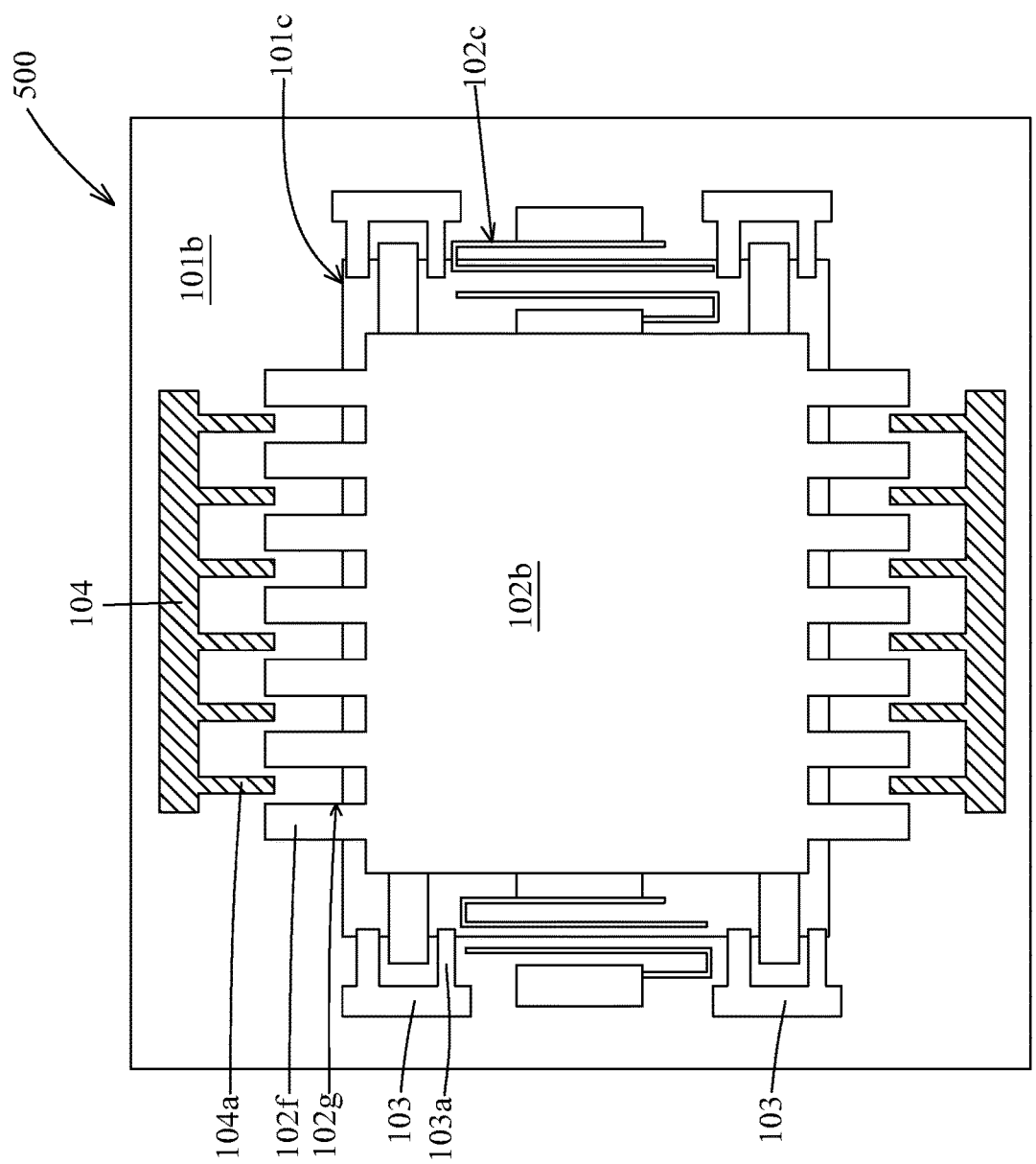
FIG. 9 is a schematic top cross-sectional view of a fifth semiconductor structure in accordance with some embodiments of the present disclosure.

FIG. 9 is a schematic top view of a fifth semiconductor structure 500 in accordance with some embodiments of the present disclosure. In some embodiments, the fifth semiconductor structure 500 is similar to the fourth semiconductor structure 400, except the arrangement of the sensing structure 103 and the actuating structure 104. In some embodiments, the sensing structures 103 are disposed opposite to each other, and the actuating structures 104 are disposed opposite to each other. In some embodiments, the sensing structure 103 is disposed at or around a corner of the device 102b. In some embodiments, the actuating structure 104 is disposed along an entire edge of the device 102b. In some embodiments, a total number of the actuating electrodes 104a is substantially greater than a total number of the sensing electrodes 103a. In some embodiments, a total top cross-sectional area of the sensing electrodes 103a is substantially less than a total top cross-sectional area of the actuating electrodes 104a.

Figure 10:
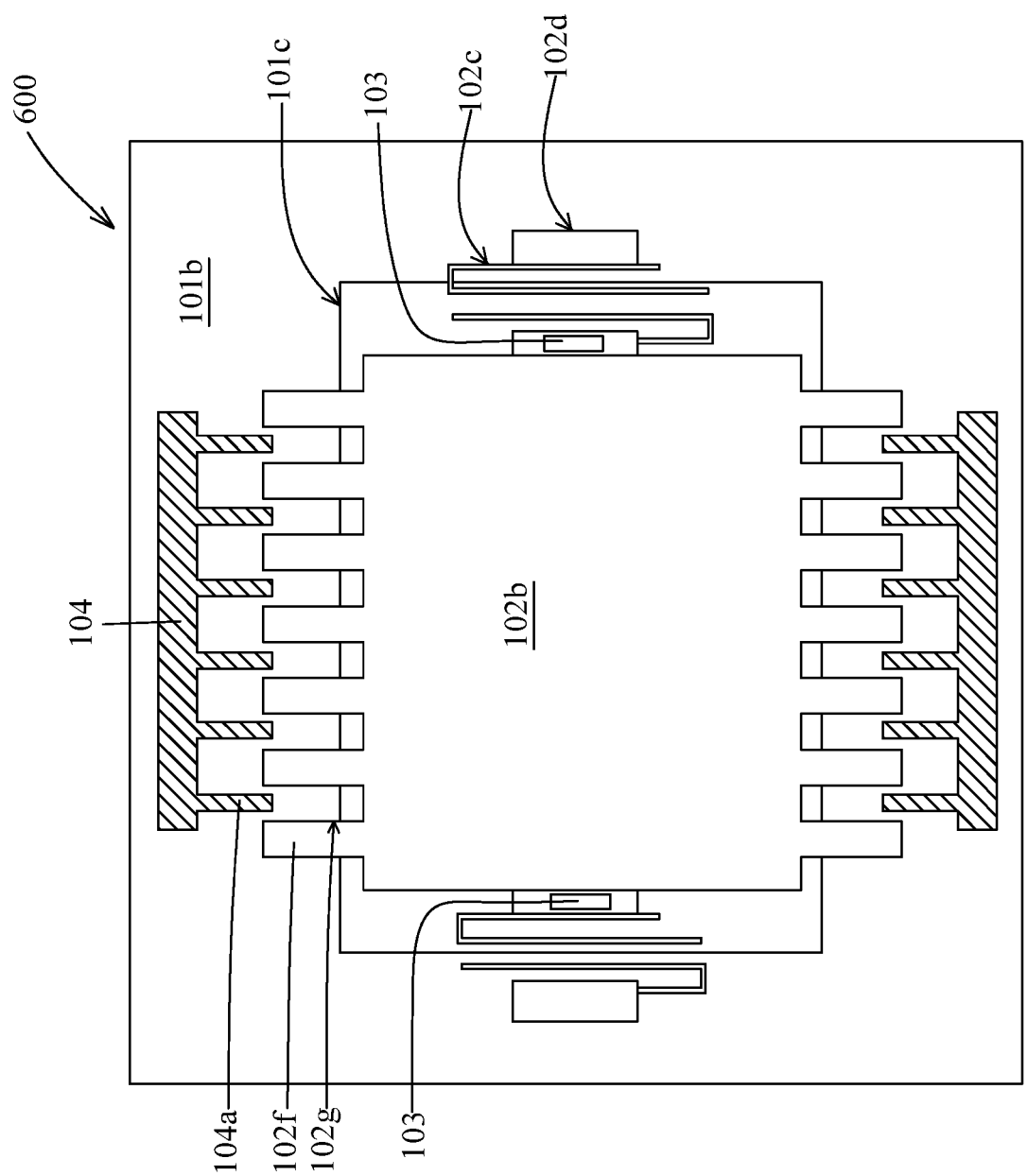
FIG. 10 is a schematic top cross-sectional view of a sixth semiconductor structure in accordance with some embodiments of the present disclosure.
Figure 11:
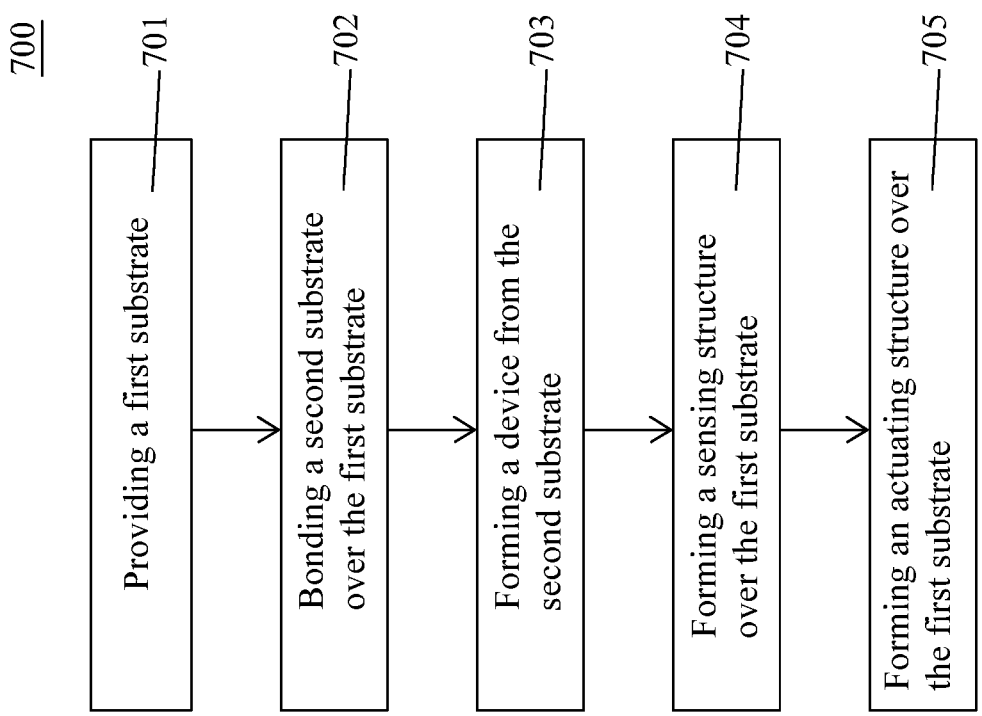
FIG. 11 is a flow diagram of a method of manufacturing a semiconductor structure in accordance with some embodiments of the present disclosure.

FIG. 10 is a schematic top view of a sixth semiconductor structure 600 in accordance with some embodiments of the present disclosure. In some embodiments, the sixth semiconductor structure 600 is similar to the fifth semiconductor structure 500, except the arrangement of the sensing structure 103. In some embodiments, the sensing structure 103 is disposed above the device 102b, the spring structure 102c or the anchoring structure 102d. In some embodiments, the sensing structure 103 is capacitive sensing, piezo-resistive sensing, piezoelectric sensing, or the like.

In the present disclosure, a method of manufacturing a semiconductor structure is disclosed. In some embodiments, a semiconductor structure (100, 200, 300, 400, 500 or 600) can be formed by a method 700 illustrated in FIG. II. The method 700 includes a number of operations and the description and illustration are not deemed as a limitation as the sequence of the operations. The method 700 includes a number of operations (701, 702, 703, 704 and 705).

Figure 12:
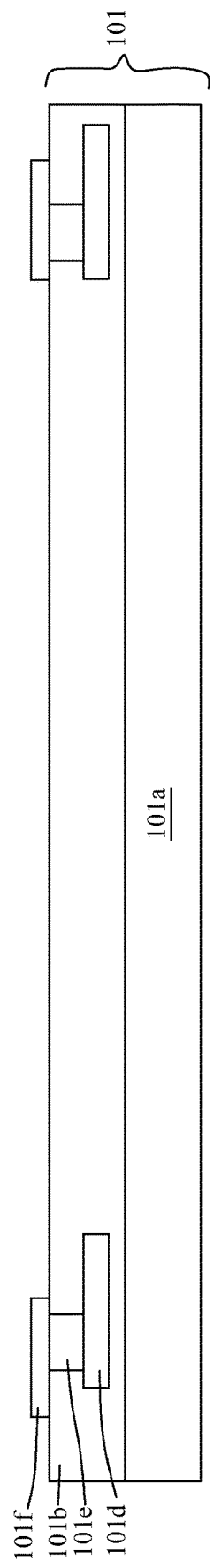

In operation 701, a first substrate 101a is provided or received as shown in FIG. 12. In some embodiments, the first substrate 101a is a semiconductive substrate, a glass substrate or a ceramic substrate. In some embodiments, the first substrate 101a is in configuration similar to the one described above or illustrated in FIG. 1 or 2. In some embodiments, a dielectric layer 101b is disposed over the first substrate 101a as shown in FIG. 12. In some embodiments, the dielectric layer 101b includes multiple layers stacking over each other. In some embodiments, the dielectric layer 101b includes dielectric material such as oxide or the like. In some embodiments, the dielectric layer 101b is formed by deposition operations such as physical vapor deposition (PVD), chemical vapor deposition (CVD) or any other suitable operations.

In some embodiments, an interconnect structure is formed within the dielectric layer 101b as shown in FIG. 12. In some embodiments, the interconnect structure including a conductive member 101d, a conductive via 101e and a first bonding pad 101f is formed over the first substrate 101a. In some embodiments, the conductive member 101d and the conductive via 101e are formed by disposing some conductive or semiconductive material over one layer of the dielectric layer 101b and then disposing another layer of the dielectric layer 101b to surround the conductive or semiconductive material. In some embodiments, the conductive material is disposed by electroplating, sputtering or any other suitable operations. In some embodiments, the conductive or semiconductive material is polysilicon, tungsten, copper, gold or the like.

In some embodiments, the first bonding pad 101f is formed on the dielectric layer 101b and over the conductive via 101e or the conductive member 101d. In some embodiments, the first bonding pad 101f is coupled with the conductive via 101e. In some embodiments, the first bonding pad 101f is formed by disposing conductive material over the dielectric layer 101b. In some embodiments, the conductive material is disposed by electroplating, sputtering or any other suitable operations. In some embodiments, the conductive material is metal such as copper or the like. In some embodiments, a first wafer 101 including the first substrate 101a, the dielectric layer 101b and the interconnect structure is formed as shown in FIG. 12.

Figure 13:
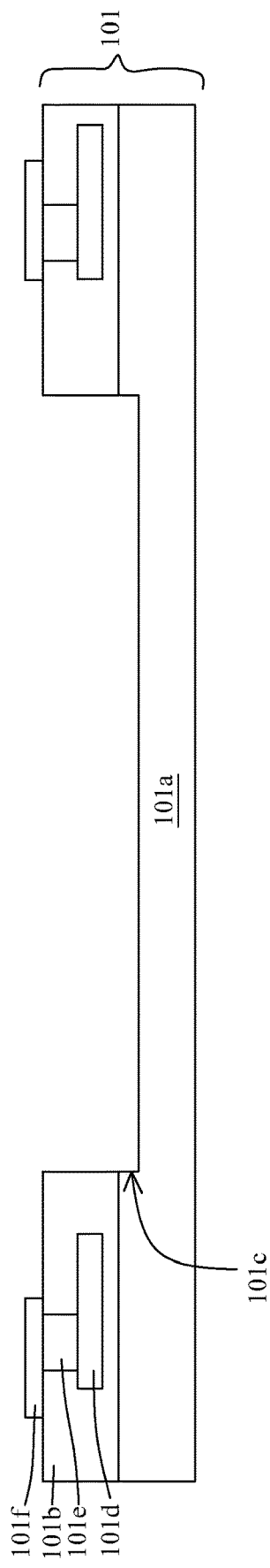
Figure 14:
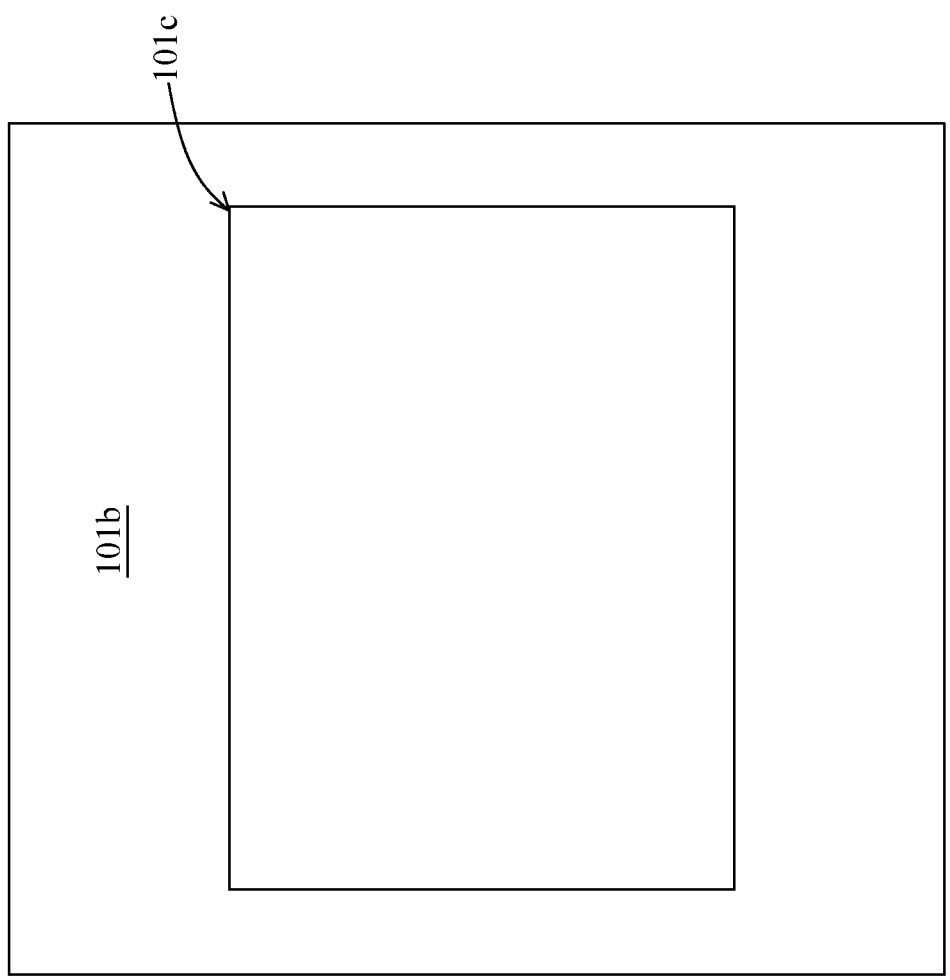

In some embodiments, a cavity 101c is formed as shown in FIGS. 13 and 14. FIG. 14 is a schematic top cross-sectional view of FIG. 13. In some embodiments, the cavity 101c is formed by removing some portions of the dielectric layer 101b. In some embodiments, the cavity 101c is formed by removing some portions of the first substrate 101a. In some embodiments, the cavity 101c extending through the dielectric layer 101c and partially through the first substrate 101a is formed. In some embodiments, some portions of the dielectric layer 101b and some portions of the first substrate 101a are removed by etching, photolithography or any other suitable operations. In some embodiments, the first substrate 101a, the dielectric layer 101b, the cavity 101c, the conductive member bold, the conductive via 101e and the first bonding pad 101f are in configurations similar to those described above or illustrated in FIG. 1 or 2.

In some embodiments, a second substrate 102a is provided or received as shown in FIG. 15. In some embodiments, the second substrate 102a is a semiconductive substrate. In some embodiments, the second substrate 102a is a silicon substrate. In some embodiments, a second bonding pad 102e is formed over the second substrate 102a. In some embodiments, the second bonding pad 102e is formed by disposing conductive material on the second substrate 102a. In some embodiments, the conductive material is disposed by electroplating, sputtering or any other suitable operations. In some embodiments, the conductive material is metal such as copper or the like. In some embodiments, a second wafer 102 including the second substrate 102a and the second bonding pad 102e is formed as shown in FIG. 15.

In operation 702, the second substrate 102a is bonded over the first substrate 101a as shown in FIG. 16. In some embodiments, the second wafer 102 is bonded over the first wafer 101. In some embodiments, the second wafer 102 is flipped prior to the bonding. In some embodiments, the second wafer 102 is bonded with the first wafer 101 by eutectic bonding, metal to metal bonding or any other suitable operations. In some embodiments, the first bonding pad 101f is bonded with the second bonding pad 102e. In some embodiments, the first bonding pad 101f is vertically aligned with the second bonding pad 102e. In some embodiments, the second wafer 102 is electrically connected to the first wafer 101 through the first bonding pad 101f and the second bonding pad 102e.

Figure 17:
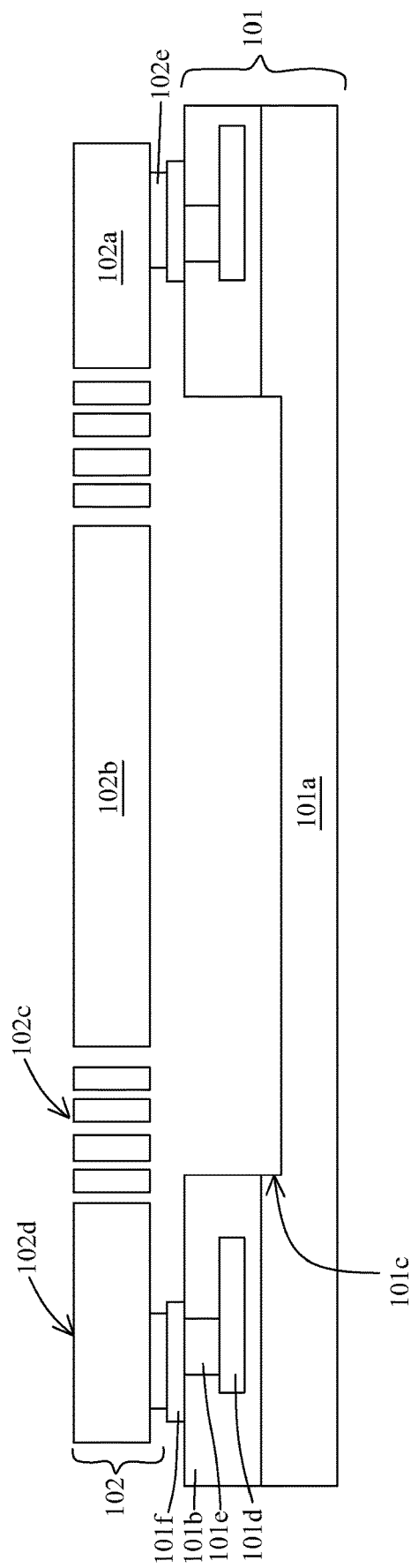
Figure 18:
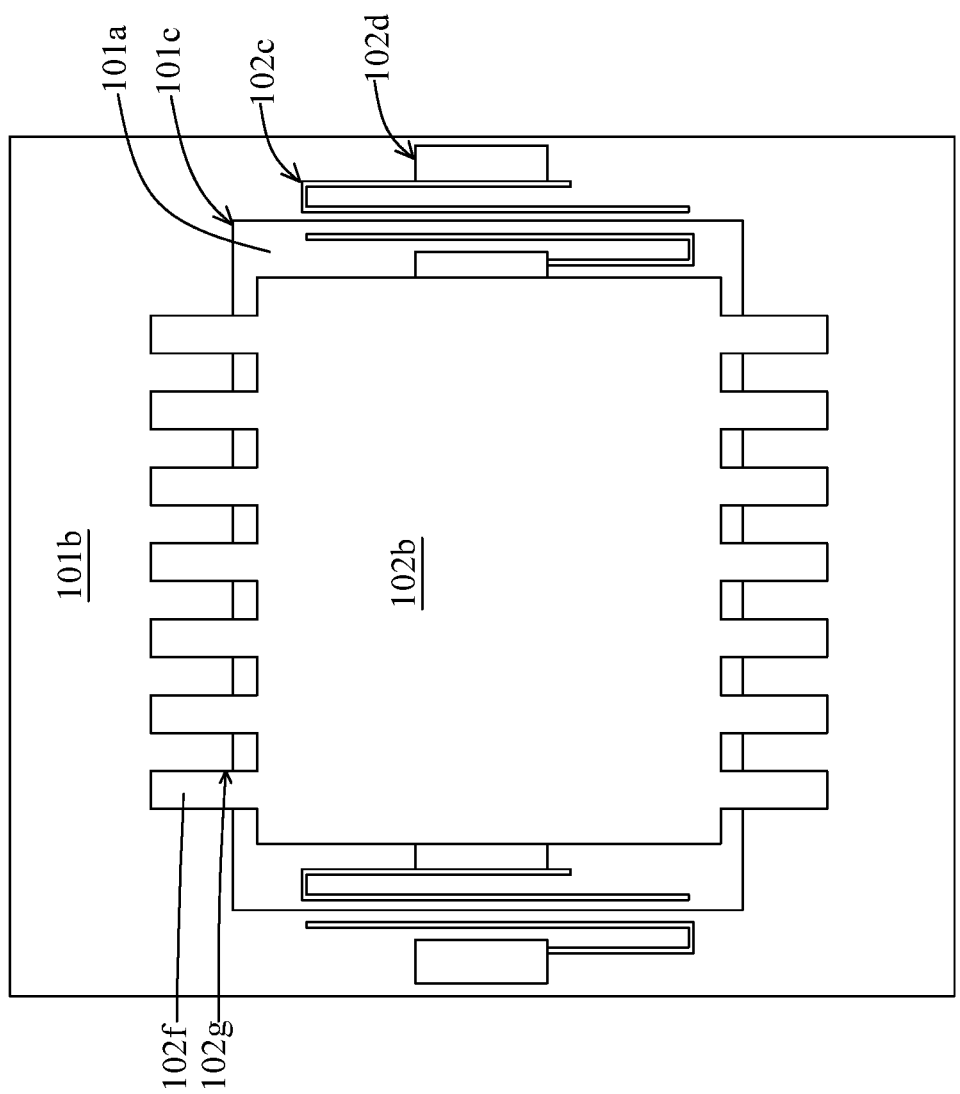

In operation 703, a device 102b is formed as shown in FIGS. 17 and 18. FIG. 18 is a schematic top cross-sectional view of FIG. 17. In some embodiments, the device 102b is formed by removing some portions of the second substrate 102b. In some embodiments, some portions of the second substrate 102b are removed by etching or any other suitable operations. In some embodiments, the device 102b is a MEMS device. In some embodiments, the device 102b is a sensing device or an actuating device. In some embodiments, the device 102b is an accelerometer, a gyroscope, a resonator, a movable micro stage, an optical device or an actuator. In some embodiments, the device 102b includes a proof mass.

In some embodiments, a spring structure 102c and an anchoring structure 102d are also formed upon, before or after the formation of the device 102b. In some embodiments, device 102b including several protruding members 102f is formed. In some embodiments, the device 102h is moveable relative to the first wafer 101. In some embodiments, the second substrate 102a, the device 102b, the spring structure 102c and the anchoring structure 102d are in configurations similar to those described above or illustrated in FIG. 1 or 2.

Figure 19:
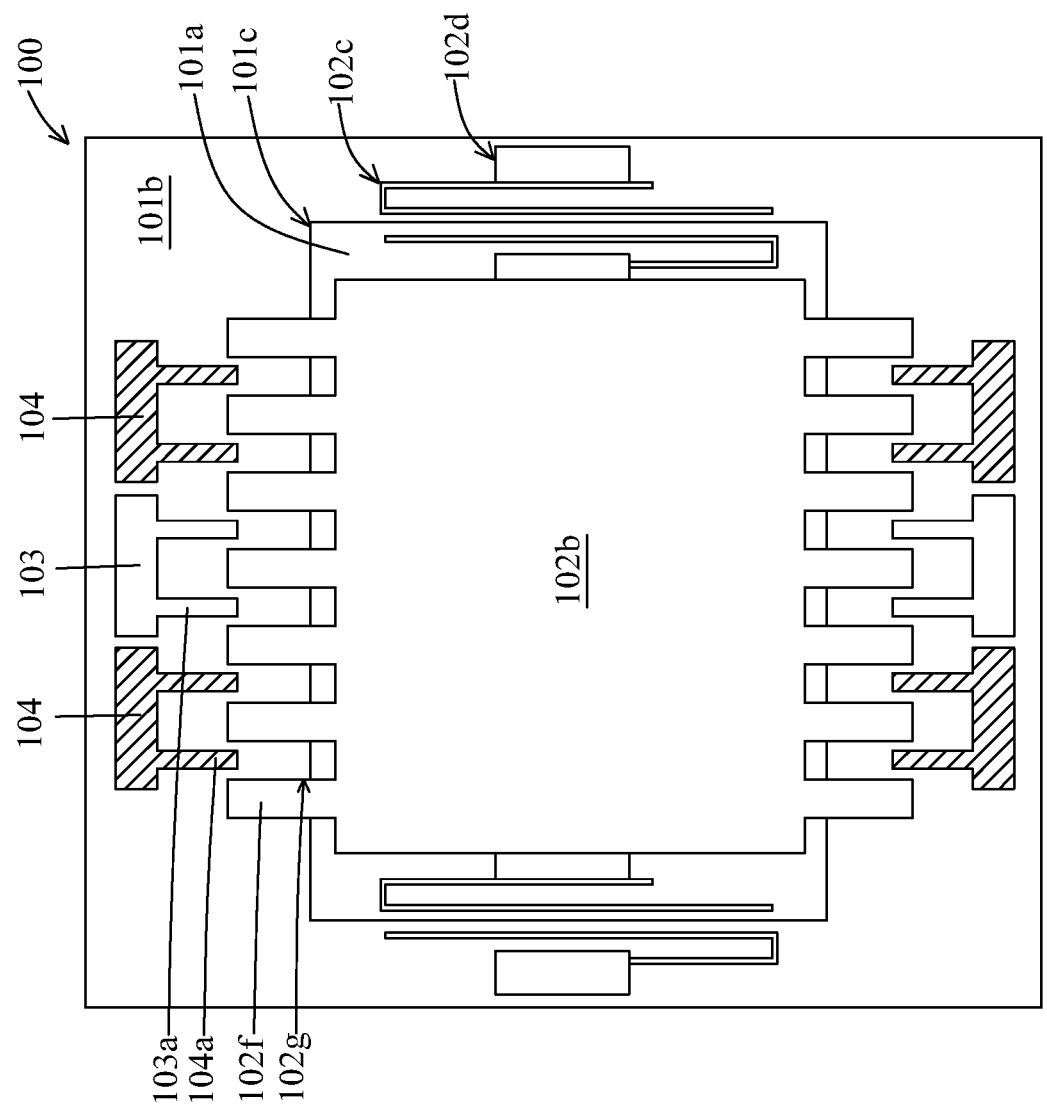

In operation 704, a sensing structure 103 is formed over the first substrate 101a and adjacent to the device 102b as shown in FIG. 19. In some embodiments, the sensing structure 103 is formed around a periphery of the device 102b. In some embodiments, the sensing structure 103 is formed by disposing conductive material over the first wafer 101 and adjacent to the device 102b. In some embodiments, the conductive material is disposed by electroplating, sputtering or any other suitable operations. In some embodiments, the sensing structure 103 includes conductive material such as metal or the like. In some embodiments, the sensing structure 103 includes copper, gold or the like. In some embodiments, the sensing structure 103 is stationary.

In some embodiments, the sensing structure 103 including several sensing electrodes 103a protruded from the sensing structure 103 is formed. In some embodiments, the sensing electrodes 103a are alternately disposed with the protruding members 102f of the device 102b. In some embodiments, the sensing structure 103 is configured to sense an external force on the device 102b and provide a feedback corresponding to the external force. In some embodiments, the sensing structure 103 is in configuration similar to the one described above or illustrated in FIG. 1 or 2.

In operation 705, an actuating structure 104 is formed over the first substrate 101a and adjacent to the device 102b as shown in FIG. 19. In some embodiments, the actuating structure 104 is formed around a periphery of the device 102b. In some embodiments, the actuating structure 104 is formed by disposing conductive material over the first wafer 101 and adjacent to the device 102b. In some embodiments, the conductive material is disposed by electroplating, sputtering or any other suitable operations. In some embodiments, the actuating structure 104 includes conductive material such as metal or the like. In some embodiments, the actuating structure 104 includes copper, gold or the like. In some embodiments, the formation of the sensing structure 103 and the formation of the actuating structure 104 are performed separately or simultaneously. In some embodiments, the device 102b is formed prior to the formation of the sensing structure 103 and the actuating structure 104.

In some embodiments, the actuating structure 104 including several actuating electrodes 104a protruded from the actuating structure 104 is formed. In some embodiments, the actuating electrodes 104a are alternately disposed with the protruding members 102f of the device 102b. In some embodiments, the actuating structure 104 is configured to provide an electrostatic force on the device 102b based on the feedback from the sensing structure 103. In some embodiments, the electrostatic force is substantially greater than the external force. In some embodiments, the actuating structure 104 is in configuration similar to the one described above or illustrated in FIG. 1 or 2. In some embodiments, a first semiconductor structure 100 as shown in FIG. 1 or 2 is formed as shown in FIG. 19. In some embodiments, a second semiconductor structure 200 as shown in FIG. 5, a fourth semiconductor structure 400 as shown in FIG. 8, a fifth semiconductor structure 500 as shown in FIG. 9 and a sixth semiconductor structure 600 as shown in FIG. 10 can be formed by the method 700.

In some embodiments, a third semiconductor structure 300 as shown in FIGS. 6 and 7 can be formed by a method similar to the method 700, except the formation of the cavity in the first wafer 101 is skipped and the actuating structure 104 is formed within the dielectric layer 101b. In some embodiments, the actuating structure 104 is formed prior to the formation of the sensing structure 103.

In the present disclosure, a semiconductor structure is disclosed. The semiconductor structure includes an active damping mechanism for protecting a device in the semiconductor structure. In some embodiments, the semiconductor structure includes a sensing structure for sensing the external force on the device, and an actuating structure for applying an electrostatic force on the device based on a feedback from the sensing structure. Therefore, the external force can be effectively suppressed by the electrostatic force. As a result, the device can be prevented from damage by the external force and can be returned to equilibrium or static state efficiently. A method of manufacturing the semiconductor structure is also disclosed.

In some embodiments, a semiconductor structure includes a substrate; a sensing device disposed over the substrate and including a plurality of protruding members protruded from the sensing device; a sensing structure disposed adjacent to the sensing device and including a plurality of sensing electrodes protruded from the sensing structure towards the sensing device; and an actuating structure disposed adjacent to the sensing device and configured to provide an electrostatic force on the sensing device based on a feedback from the sensing structure.

In some embodiments, the actuating structure is isolated from the sensing structure. In some embodiments, the sensing device is movable relative to the sensing structure, and the sensing structure is stationary. In some embodiments, the actuating structure includes a plurality of actuating electrodes protruded from the actuating structure towards the sensing device and alternately disposed with the plurality of protruding members. In some embodiments, each of the plurality of actuating electrodes includes a length extending from the actuating structure towards the sensing device and a width substantially orthogonal to the length, and a ratio of the length to the width is substantially less than 10.

In some embodiments, a gap between one of the plurality of actuating electrodes and one of the plurality of protruding members adjacent to the one of the plurality of actuating electrodes is about 1 um to about 5 um. In some embodiments, the actuating structure is disposed between the sensing device and the substrate. In some embodiments, further comprising a dielectric layer disposed over the substrate, wherein the actuating structure is disposed within the dielectric layer. In some embodiments, the sensing device is an inertial sensor. In some embodiments, further comprising a dielectric layer disposed over the substrate, and a cavity extending through the dielectric layer and partially through the substrate, wherein the sensing device is disposed above the cavity. In some embodiments, the plurality of sensing electrodes are alternately disposed with the plurality of protruding members. In some embodiments, the sensing structure and the actuating structure surround the sensing device.

In some embodiments, a semiconductor structure includes a substrate; an actuating device disposed over the substrate and including a plurality of protruding members protruded from the actuating device; a sensing structure disposed adjacent to the actuating device; and an actuating structure disposed adjacent to the actuating device, including a plurality of actuating electrodes protruded from the actuating structure towards the actuating device, and configured to provide an electrostatic force on the actuating device based on a feedback from the sensing structure.

In some embodiments, the sensing structure includes a plurality of sensing electrodes protruded from the sensing structure towards the actuating device and alternately disposed with the plurality of protruding members. In some embodiments, the sensing structure is disposed above the actuating device. In some embodiments, the plurality of actuating electrodes are alternately disposed with the plurality of protruding members. the actuating device is an actuator or a resonator.

In some embodiments, a method of manufacturing a semiconductor structure includes providing a first substrate; bonding a second substrate over the first substrate; forming a device from the second substrate; forming a sensing structure over the first substrate and adjacent to the device; and forming an actuating structure over the first substrate and adjacent to the device, wherein the device is formed prior to the formation of the sensing structure and the actuating structure, and the sensing structure and the actuating structure are formed simultaneously or separately.

In some embodiments, the actuating structure is formed between the first substrate and the device. In some embodiments, the sensing structure is configured to sense an external force on the device and transmit a feedback to the device, the actuating structure is configured to provide an electrostatic force on the sensing structure based on the feedback, and the electrostatic force is substantially greater than the external force.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
a substrate;
a dielectric layer disposed over the substrate;
a cavity extending through the dielectric layer and partially through the substrate:
a sensing device disposed over the cavity of the substrate and including a plurality of protruding members protruded from the sensing device;
a sensing structure disposed adjacent to the sensing device and including a plurality of sensing electrodes protruded from the sensing structure towards the sensing device; and
an actuating structure disposed adjacent to the sensing device and configured to provide an electrostatic force on the sensing device based on a feedback from the sensing structure; wherein
the sensing structure surrounds the actuating structure, and
wherein the sensing structure and the actuating structure are disposed in a mirror image pattern across two sides of the sensing device.

2. The semiconductor structure of claim 1, wherein the actuating structure is mechanically isolated from the sensing structure.

3. The semiconductor structure of claim 1, wherein the sensing device is movable relative to the sensing structure, and the sensing structure is stationary.

4. The semiconductor structure of claim 1, wherein the actuating structure includes a plurality of actuating electrodes protruded from the actuating structure towards the sensing device and alternately disposed with the plurality of protruding members.

5. The semiconductor structure of claim 4, wherein each of the plurality of actuating electrodes includes a length extending from the actuating structure towards the sensing device and a width substantially orthogonal to the length, and a ratio of the length to the width is substantially less than 10.

6. The semiconductor structure of claim 4, wherein a gap between one of the plurality of actuating electrodes and one of the plurality of protruding members adjacent to the one of the plurality of actuating electrodes is about 1 um to about 5 um.

7. The semiconductor structure of claim 1, wherein the actuating structure includes electrically conductive material.

8. The semiconductor structure of claim 7, further comprising an interconnect structure in the dielectric layer, wherein the actuating structure is electrically connected to the interconnect structure.

9. The semiconductor structure of claim 1, wherein the sensing device is an inertial sensor.

10. The semiconductor structure of claim 4, wherein a total number of the plurality of actuating electrodes is substantially less than a total number of the plurality of sensing electrodes.

11. The semiconductor structure of claim 1, wherein the plurality of sensing electrodes are alternately disposed with the plurality of protruding members.

12. The semiconductor structure of claim 1, wherein one of the plurality of actuating electrodes is protruded into a recess between two of the plurality of protruding members in a length substantially less than or equal to 5 um.

13. A semiconductor structure, comprising:
a substrate;
a cavity extending partially through the substrate:
a sensing device disposed over the cavity of the substrate;
a sensing structure disposed adjacent to an edge of the sensing device; and
an actuating structure disposed adjacent to the sensing structure and the edge of the sensing device, configured to provide an electrostatic force on the sensing device based on a feedback from the sensing structure, and surrounding the sensing structure; wherein
the sensing structure surrounds the actuating structure, and
wherein the sensing structure and the actuating structure are disposed in a mirror image pattern across two sides of the sensing device.

14. The semiconductor structure of claim 13, wherein the sensing structure includes a plurality of sensing electrodes protruded from the sensing structure towards the sensing device.

15. The semiconductor structure of claim 14, wherein the sensing device includes a plurality of protruding members protruded from the sensing device and alternately disposed with the plurality of sensing electrodes.

16. The semiconductor structure of claim 15, wherein the actuating structure includes a plurality of actuating electrodes protruded from the actuating structure towards the sensing device.

17. The semiconductor structure of claim 16, wherein the plurality of actuating electrodes are alternately disposed with the plurality of protruding members.

18. The semiconductor structure of claim 13, wherein the sensing structure is capacitive sensing, piezo-resistive sensing or piezoelectric sensing.

19. A semiconductor structure, comprising:
a substrate;
a cavity extending partially through the substrate:
a sensing device disposed over the cavity of the substrate and including a plurality of protruding members protruded from the sensing device;
a sensing structure disposed adjacent to the sensing device and including a plurality of sensing electrodes protruded from the sensing structure towards the sensing device; and
an actuating structure disposed adjacent to the sensing device, including a plurality of actuating electrodes protruded from the actuating structure towards the sensing device,
wherein the plurality of protruding members are alternately disposed with the plurality of sensing electrodes and the plurality of actuating electrodes, and a total top cross-sectional area of the plurality of the sensing electrodes is substantially greater than a total top cross-sectional area of the plurality of the actuating electrodes; wherein
the sensing structure surrounds the actuating structure, and
wherein the sensing structure and the actuating structure are disposed in a mirror image pattern across two sides of the sensing device.

20. The semiconductor structure of claim 19, wherein the sensing device is movable relative to the sensing structure and the actuating structure.

* * * * *